Oct. 16, 1951 J. C. TELLIER 2,571,309

TUNING AID FOR FREQUENCY MODULATION RECEIVERS

Filed Feb. 26, 1946

INVENTOR.

JOSEPH C. TELLIER

BY William E. Denk

AGENT

Patented Oct. 16, 1951

2,571,309

UNITED STATES PATENT OFFICE 2,571,309

TUNING AID FOR FREQUENCY-MODULATION RECEIVERS

Joseph C. Tellier, Penn Wynne, Pa., assignor, by mesne assignments, to Philco Corporation, Philadelphia, Pa., a corporation of Pennsylvania Application February 26, 1946, Serial No. 650,347

8 Claims. (Cl. 250—20)

Figures 1, 2:
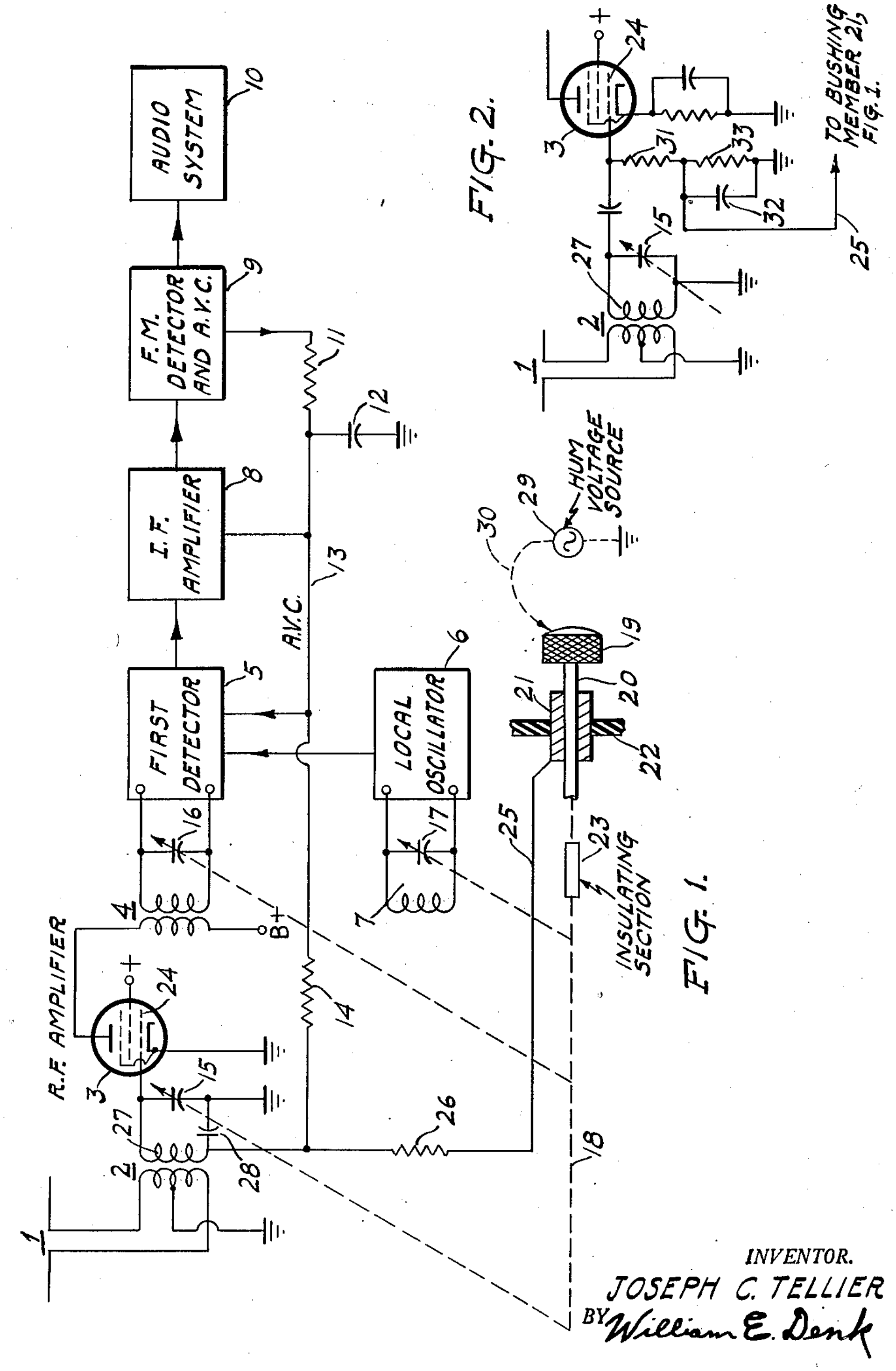

The invention herein described and claimed relates to radio receivers adapted for use in the reception of frequency modulated carrier waves; more particularly the invention relates to an improved tuning aid for use in the manual tuning of frequency modulation receivers.

It is a known characteristic of frequency modulation receivers that their freedom from amplitude-modulation components of interference (noise) is greatest when the receiver is properly tuned, i. e., when the frequency modulated carrier to be detected is accurately centered with respect to the center-frequency of the detector circuit. This is true regardless of whether the receiver is, or is not, provided with an amplitude limiter or its equivalent. For the operator, the tuning operation is complicated by the fact that frequency modulation receivers generally exhibit a pair of spurious tuning regions, one to either side of the proper central tuning region. In these spurious tuning regions the discrimination of the system against amplitude modulation falls to a minimum, and harmonic distortion becomes substantial. Accordingly it is most important that the operator first ascertain which of these three regions is the central tuning region, and then carefully tune the receiver to substantially the center of the central tuning region.

A very effective method and means for enabling an operator properly to adjust the tuning of a frequency modulation receiver is described and claimed in U. S. Patent No. 2,310,304, which issued on February 9, 1943, to C. T. McCoy and P. M. Craig. In the receiver disclosed in that patent there is provided, inter alia, a source of modulating voltage of audible frequency, an amplitude modulator, and a manually operated switch, through the agency of which an operator may effect amplitude modulation of the frequency modulated carrier wave in the receiver's intermediate frequency amplifier. If the receiver of the aforementioned patent is improperly tuned, and hence relatively sensitive to amplitude modulation, the audio frequency modulating tone will be heard when the manually operated switch is closed. The operator then readjusts the tuning of the receiver to that point where the modulating tone reaches a minimum volume level. This point coincides with the receiver's optimum tuning adjustment. The receiver now being correctly tuned, the manually operated switch is opened, and the tuning operation is complete. It is important that the above-described amplitude modulation of the carrier wave be discontinued upon the completion of the tuning operation, because otherwise (even though the receiver be most precisely tuned) there would remain a small but finite component of detector output whose presence could be traced to the aforesaid amplitude modulation of the carrier wave.

The present invention utilizes the basic principles of the above-mentioned patent, but provides a novel circuit arrangement by means of which the aforementioned manually operated switch may be eliminated. In accordance with the present invention, the amplitude modulation of the carrier wave is automatically instituted as soon as the operator begins to tune the receiver, and is automatically discontinued when the operator completes the tuning operation.

Accordingly it is a principal object of the present invention to provide a novel and improved tuning indicator for use in a frequency modulation receiver.

Another object of the invention is to provide a tuning indicator of the type aforementioned which is effective, and simple in construction, and which does not require the use of special indicators or additional vacuum tubes.

These and other objects of the invention, and the manner in which they are attained, will appear from the following detailed description and the accompanying drawings, in which Fig. 1 is a schematic diagram of one embodiment of the invention as applied to an otherwise conventional frequency modulation receiver; and Fig. 2 is an alternative embodiment of a portion of the receiver illustrated in Fig. 1.

The frequency modulation receiver of Fig. 1 includes an antenna 1, a tuned antenna transformer 2, a tuned radio frequency stage comprising the pentode amplifier tube 3 and tuned transformer 4, a first detector stage 5, a local oscillator 6 tunable through the agency of its tank circuit 7, an intermediate frequency amplifier 8, a frequency modulation detector and automatic volume control stage 9, and an audio frequency amplifier and output system 10. For reasons which will appear hereinafter, the frequency modulation detector must be of that type—well known to those skilled in the art—whose response to amplitude modulation is a minimum when the receiver is correctly tuned. Automatic volume control (A. V. C.) voltage, derived from the apparatus 9, may be applied to appropriate gain control electrodes in the intermediate frequency amplifier 8, first detector 5, and radio frequency amplifier pentode 3. The A. V. C. circuit includes the resistance-capacitance filter 11—12, the conductor 13, and the resistor 14. Variable capacitors 15, 16, and 17, which control the tuning of the antenna, radio frequency, and local oscillator stages, may be ganged together on a common shaft 18, shown diagrammatically in the drawing. All of the foregoing apparatus is conventional, and consequently it is deemed unnecessary to describe it in greater detail.

In accordance with the present invention, means, operative only during the tuning process, are provided for amplitude modulating the received frequency-modulated carrier waves in accordance with alternating voltages (more specifically, hum voltages) derived from ambient electric fields established by electric power circuits in the vicinity of the receiving apparatus. After the receiver has been tuned to approximately the desired frequency, the tuned circuits of the receiver are adjusted to that point where the hum component, which manifests itself in the reproduced signal, falls to a minimum. This point, at which the receiver discriminates most effectively against amplitude components of carrier wave modulation, represents correct tuning for the receiver. The tuning operation being completed, the amplitude modulation of the received carrier wave is discontinued.

In practicing the present invention, I effect amplitude modulation of the received carrier wave in accordance with audio frequency voltages derived from the aforementioned ambient electric fields. I apply these derived modulating voltages to the receiver by way of the operator himself, and in such manner that the modulating voltages are applied to the receiver only when the operator's hand is in contact with the receiver's tuning control manual, i. e. with that portion of the tuning control which is normally grasped or contacted by the operator during the tuning process.

More specifically, an electrical circuit—capable of transmitting voltages in the audio frequency range—is connected between an amplitude modulating device in a carrier wave channel of said receiver and an electrically conductive portion of said tuning control manual so that the operator, serving as an antenna responsive to said ambient electric fields, automatically effects amplitude modulation of the received carrier whenever he places his hand on the conductive portion of said manual.

Considering the invention in greater detail, and with specific reference to the embodiment of Fig. 1, there is provided a manually operated tuning control manual or knob 19 mounted on a drive shaft 20. Drive shaft 20 is seated in a suitable bushing member 21. The shaft 20 is mechanically coupled to the common shaft 18 of the variable tuning capacitors 15, 16, and 17. The knob or manual 19, shaft 20, and bushing member 21 are each constructed of an electrically conductive material, but these elements are insulated from the chassis, and from other grounded elements of the receiver, by means of the insulated bushing support member 22 and the insulating section 23 of shaft 18. The section 23 may be interposed between the drive shaft 20 and driven shaft 18 as is indicated diagrammatically in the drawing. When, as is now customary, the shaft 20 drives the driven shaft 18 through the agency of a pulley and dial cord arrangement, the dial cord will serve as the insulating section 23 of Fig. 1.

The bushing member 21 (and hence also knob 19) is connected to the control grid 24 of pentode 3 through a path comprising the conductor 25, resistor 26 (optional), and the secondary winding 27 of transformer 2. A small capacitor 28 (which may be of the order of 1500 micromicrofarads) bypasses the low-potential end of winding 27 to ground at radio frequencies to insure that the tuning of the resonant circuit comprising the winding 27 and variable capacitor 15 will not be deleteriously affected by capacity changes which may occur between the tuning knob 19 and ground. The presence of the bypass capacitor 28 also prevents the injection of spurious radio frequency signals into the resonant circuit 15, 27 by way of elements 19, 20, 21, 25, and 26.

The operator, who is at all times subject to the ambient electric fields established by nearby electric power circuits, serves as a source of alternating voltage, the frequency of which corresponds to the frequency of the power circuits from which the said voltage is derived. The operator, as a source of audible hum voltage, is represented diagrammatically in Fig. 1 by the generalized hum voltage source 29.

When the operator grasps the knob 19 to tune the receiver, the hum voltage source 29 is effectively coupled to the knob 19, as indicated by the dotted conductor 30. The hum voltage is then applied, by means including the conductor 25 and transformer winding 27, to the control grid 24 of pentode 3—in consequence of which the frequency modulated signal passing through the radio frequency amplifier stage is amplitude modulated in accordance with the said hum voltage. The operator now rotates the knob 19 in both clockwise and counter-clockwise directions through the desired signal, noting the variation in the reproduced hum intensity as he does so. Then he carefully adjusts the tuning to that point where the intensity of the reproduced hum falls to a minimum. At this point the receiver is correctly tuned, and the operator, in removing his hand from the tuning control manual 19, simultaneously removes the modulating voltage from control grid 24.

In practice, where the electric power circuits in the building are supplied with alternating current at 110 volts and 60 cycles, it is found that the hum voltage available for application to the modulating grid 24 by the above-described arrangement is of the order of a volt. Oscilloscopic tests indicate that harmonics of the 60 cycle supply voltage are relatively strong, indicative, possibly, of the fact that the capacitive coupling between the operator and the power line is more effective at the harmonic frequencies. In any event the practical result of this effect is to make the tone of the hum more pleasing than if only a pure 60 cycle modulating wave were present.

It has been found that a volt of modulating signal at the control grid of the radio frequency amplifier tube 3 may result in a reproduced hum signal which is louder than that desired. If such is found to be the case the signal may be applied to the control grid of one of the following carrier wave stages (e. g. the first detector 5, or intermediate frequency amplifier 8), or the voltage actually applied at grid 24 may be reduced by the insertion in conductor 25 of a suitable voltage dropping resistor 26. In general, to effect a substantial reduction in the applied voltage, the resistor 26 must be large, e. g. of the order of megohms rather than ohms), because the effective source 29 and the grid circuit of tube 3 both have very high impedances at audio frequencies. It may be noted at this point that, due to the very high D.-C. impedance of the circuit comprising elements 29, 30, 19, 20, 21, 25 and 26, the hum modulating circuit will have no deleterious effect upon the receiver's automatic volume control circuit with which it is associated at the junction of winding 27 and resistor 14.

It has been stated that the tuning control knob 19 should be constructed of an electrically conducting material. For this purpose any of the usual metals from which receiver components and fittings are normally made will be satisfactory. However if, in accordance with conventional practice, it is preferred to mold the knob from a plastic material this may be done through suitable choice of an electrically conducting plastic material, of which a number of types are available commercially. In some instances, too, it may be sufficient to employ a conventional insulated knob having a relatively large, conductive core or bushing insert, reliance being placed on the presence of capacity coupling between the hand of the operator and the bushing insert.

If the receiver is located in a building supplied with D.-C. rather than A.-C. electric power, the tone modulation applied to the carrier through the agency of the present invention will be that due to commutator ripple in the supply line. Although this ripple voltage is relatively small compared to the voltage available in an A.-C. system, this is compensated by the fact that the ripple frequency is relatively high, and the coupling between line and operator correspondingly greater.

Reference may now be had to Fig. 2 in which there is illustrated, schematically, an alternative embodiment of a portion of the radio frequency circuit of Fig. 1. Corresponding elements in these figures are designated with like reference characters. The arrangement of Fig. 2 differs from that of Fig. 1 in the specific connection employed between the conductor 25 and control grid 24, and in the omission of the A. V. C. connection. In the arrangement of Fig. 2, the tuning control knob is connected to grid 24 by way of conductor 25 and resistor 31. The junction of resistor 31 and conductor 25 is bypassed to ground, at carrier frequencies, by the capacitor 32. The magnitude of the hum voltage applied to grid 24 may be reduced, if desired, by the addition of a resistor 33 of appropriate size connected between the lower end of resistor 31 and ground.

Tests have shown that the method of tuning herein described is applicable to frequency modulation receivers generally, even though they may be supplied with highly effective amplitude limiters, or are otherwise substantially immune to amplitude modulation of the received carrier wave. The reason for this possibly unexpected operation appears to reside in the fact that the amplitude modulation effected by the present method may be very large, e. g. of the order of 100% or more. Under these conditions the carrier may actually be cut off during a portion of each cycle of the hum frequency. Manifestly no frequency modulation detector, however perfect, can ignore such cyclical gaps in the carrier wave. It has been found, however, that even under these conditions minimum hum outputs occur at the correct, central tuning point.

Although described with particular reference to certain illustrated embodiments, it will be apparent that my invention is capable of other forms of physical expression, and it is, accordingly, limited only by the spirit and scope of the appended claims.

I claim:

1. The method of tuning a frequency modulation radio receiver having a carrier wave channel, a frequency modulation detector whose response to amplitude modulation is a minimum when said receiver is correctly tuned, a tuning device, and an electrically conductive tuning control manual which is electrically insulated from ground and mechanically coupled to said tuning device, which method comprises: deriving hum voltages from ambient electric fields established by electric power circuits external to said receiver, manually applying said derived voltages to said tuning control manual, amplitude-modulating the wave in said carrier wave channel in accordance with the voltages thus applied, and manually adjusting said tuning control manual to that point where the reproduced hum is a minimum.

2. In an electrical system adapted for use in the vicinity of electric power circuits and within the ambient electric fields which inherently surround said power circuits, a control manual adapted to be contacted by the hand of an operator and manipulated during adjustment thereof, at least a portion of said control manual being electrically conductive, a vacuum tube circuit, the operation of said electrical system being subject to the control influence of both said vacuum tube circuit and said control manual, means electrically isolating the conductive portion of said control manual from points of fixed potential in said system, means effectively isolating said conductive portion electrically from points of alternating potential in said system, and means effective at audio frequencies for electrically coupling said conductive portion to said vacuum tube circuit to impress on said circuit alternating voltages applied to said control manual during manipulation thereof.

3. In a radio receiver adapted for use in the vicinity of electric power circuits and within the ambient electric fields which inherently surround said power circuits, said receiver having a chassis, a plurality of vacuum tube circuits mounted thereon, and a tuning device, the combination comprising: a tuning control manual mechanically coupled to said tuning device and adapted to be contacted by the hand of an operator during manual adjustment of said tuning device, at least a portion of said control manual being electrically conductive, means isolating the electrically conductive portion of said control manual from said chassis, means effectively isolating said conductive portion electrically from points of alternating potential in said receiver, and means effective at audio frequencies for electrically coupling the electrically conductive portion of said control manual to one of said vacuum tube circuits to impress on said circuit alternating voltages applied to said control manual during manipulation thereof.

4. In a frequency modulation radio receiver adapted for use in the vicinity of electric power circuits and within the ambient electric fields which inherently surround said power circuits, said receiver having elements including a chassis, a vacuum tube stage operating at a carrier wave frequency, a tuning device, and a frequency modulation detector whose response to amplitude modulation is a minimum when said receiver is correctly tuned: apparatus for guiding an operator in the correct tuning of said radio receiver, said apparatus comprising a tuning control manual mechanically coupled to said tuning device and adapted to be contacted by the hand of said operator and manipulated during the tuning of said radio receiver, at least a portion of said control manual being electrically conductive, means for insulating said tuning control manual from said chassis, means effectively isolating said tuning control manual electrically from points of alternating potential in said receiver, and an electrical connection between said conductive portion and a carrier-amplitude control element of said vacuum tube stage, the impedance between said connection and said chassis being high at audio frequencies.

5. In a frequency modulation radio receiver adapted for use in the vicinity of electric power circuits and within the ambient electric fields which inherently surround said power circuits, said receiver having a tuning device, a chassis, a plurality of stages in cascade including a frequency detector stage whose discrimination against amplitude modulation is optimum when said receiver is correctly tuned, and a stage preceding said frequency detector stage, said preceding stage operating at a carrier wave frequency and having means associated therewith for amplitude modulating the carrier wave therein: apparatus for guiding an operator in the correct tuning of said radio receiver, said apparatus comprising elements including a tuning control manual mechanically coupled to said tuning device and adapted to be contacted by the hand of said operator and manipulated during the tuning of said radio receiver, at least a portion of said control manual being electrically conductive, means for insulating said tuning control manual from said chassis and from other points of fixed potential, means effectively isolating said tuning control manual electrically from points of alternating potential in said receiver, and means effective at audio frequencies for electrically coupling said conductive portion and said modulating means.

6. In a frequency modulation radio receiver adapted for use in the vicinity of electric power circuits and within the ambient electric fields which inherently surround said power circuits, said receiver having a tuning device, a chassis, a plurality of vacuum tubes in cascade including a vacuum tube to whose control grid a received signal is applied, and a frequency modulation detector whose discrimination against amplitude modulation is optimum when said receiver is correctly tuned: apparatus for guiding an operator in the correct tuning of said receiver, said apparatus comprising elements including a tuning control manual mechanically coupled to said tuning device and adapted to be contacted by the hand of said operator and manipulated during the tuning of said radio receiver, at least a portion of said control manual being electrically conductive, means for insulating said tuning control manual from said chassis and from other points of fixed potential, means effectively isolating said tuning control manual electrically from points of alternating potential in said receiver, and an electrical connection between said conductive portion and said control grid, the impedance between said connection and said chassis being high at audio frequencies.

7. A frequency modulation receiver as claimed in claim 6, wherein said electrical connection includes a circuit element of high D.-C. resistance.

8. A frequency modulation receiver adapted for use in the vicinity of electric power circuits and within the ambient electric fields which inherently surround said power circuits, said receiver comprising elements including a chassis, a carrier wave channel, apparatus for amplitude modulating the carrier wave in said channel, means for tuning said receiver to a desired carrier wave, a frequency modulation detector whose response to amplitude components of carrier wave modulation is a minimum when said tuning device is correctly adjusted, a tuning control manual mechanically coupled to said tuning means and adapted to be contacted by the hand of an operator during manual adjustment of said tuning means, said tuning control manual being electrically conductive, means for electrically insulating said tuning control manual from said chassis and from said tuning means, means effectively isolating said tuning control manual electrically from points of alternating potential in said receiver, and an electrical circuit effective at audio frequencies for coupling said tuning control manual and said modulating apparatus, whereby carrier waves in said channel are amplitude modulated in accordance with alternating voltages applied to said control manual by an operator during manual tuning of said receiver.

JOSEPH C. TELLIER.

REFERENCES CITED

The following references are of record in the file of this patent:

UNITED STATES PATENTS

| Number | Name | Date |
|---|---|---|
| 1,510,624 | Kloneck | Oct. 7, 1924 |
| 2,077,573 | Loughlin | Apr. 20, 1937 |
| 2,186,825 | Dome | Jan. 9, 1940 |
| 2,189,050 | Van Loon | Feb. 6, 1940 |
| 2,310,304 | McCoy et al. | Feb. 9, 1943 |
| 2,355,395 | Rubenstein | Aug. 8, 1944 |